(12) United States Patent
Kim et al.

(10) Patent No.: US 8,581,753 B2
(45) Date of Patent: Nov. 12, 2013

(54) LOSSLESS CODING TECHNIQUE FOR CABAC IN HEVC

(75) Inventors: Seung-Hwan Kim, Vancouver, WA (US); Christopher Andrew Segall, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 72 days.

(21) Appl. No.: 13/360,615

(22) Filed: Jan. 27, 2012

(65) Prior Publication Data

US 2013/0187796 A1 Jul. 25, 2013

Related U.S. Application Data

(63) Continuation-in-part of application No. 13/354,272, filed on Jan. 19, 2012.

(51) Int. Cl.
*H03M 7/34* (2006.01)

(52) U.S. Cl.
USPC .............................................. 341/51; 341/107

(58) Field of Classification Search
USPC .................................................. 341/51, 107
See application file for complete search history.

(56) References Cited

U.S. PATENT DOCUMENTS

| | | | |
|---|---|---|---|
| 6,658,167 B1 | 12/2003 | Lee | |
| 7,088,271 B2 * | 8/2006 | Marpe et al. | 341/107 |
| 7,167,988 B2 | 1/2007 | Hayashi | |
| 7,286,710 B2 * | 10/2007 | Marpe et al. | 382/239 |
| 7,369,066 B1 * | 5/2008 | Benzreba et al. | 341/51 |
| 7,991,610 B2 | 8/2011 | Sperschneider | |
| 8,046,214 B2 | 10/2011 | Mehrotra | |
| 8,180,915 B2 | 5/2012 | Zhao | |
| 8,249,883 B2 | 8/2012 | Mehrotra | |
| 2013/0114684 A1 | 5/2013 | Kim | |
| 2013/0114687 A1 | 5/2013 | Kim | |

OTHER PUBLICATIONS

Joint Collaborative Team on video Coding (JCT-VC) of ITU-T SG16 WP3 and ISO/IEC JTC1/SC29/WG11; Title: "WD4: Working Draft 4 of High-Efficiency Video Coding"; Authors: Benjamin Bross, Woo-Jin Han, Jens-Rainer Ohm, Gary J. Sullivan and Thomas Wiegand; 6th Meeting: Torino, IT; Jul. 14-22, 2011; 235 pages.
Joint Collaborative Team on Video Coding (JCT-VC) of ITU-T SG16 WP3 and ISO/ISC JTC1/SC29/WG11; Title: "Single entropy coder for HEVC with a high throughput binarization mode"; Authors: Jani Lainema, Kemal Ugur and Antti Hallapuro; 7th Meeting: Geneva, CH; Nov. 21-30, 2011; 9 pages.
International Searching Authority; International Search Report dated Apr. 23, 2013 for PCT/JP2013/000242; 4 pages.
Joint Collaborative Team on Video Coding (JCT-VC) of ITU-T SG16 WP3 and ISO/IEC JTC1/SC29/WG11, "WD5: Working Draft 5 of High-Efficiency Video Coding", 7th Meeting: Geneva, CH, Nov. 21-30, 2011; Version 4—Jan. 9, 2012.
Stolowitz Ford Cowger LLC, listing of related cases, Jan. 27, 2012.

* cited by examiner

*Primary Examiner* — Khai M Nguyen
(74) *Attorney, Agent, or Firm* — Stolowitz Ford Cowger LLP

(57) ABSTRACT

A system utilizing a lossless coding technique for CABAC in HEVC is described. The system includes a first and second electronic device. The first electronic device encodes according to a lossless coding technique for CABAC in HEVC. The second electronic device decodes according to a lossless coding technique for CABAC in HEVC.

20 Claims, 24 Drawing Sheets

(background)

| Scanning Position | 0 | 1 | 2 | 3 | 4 | 5 | 6 | 7 | ... |
|---|---|---|---|---|---|---|---|---|---|
| Coefficient Level | 4 | 0 | 3 | -3 | 2 | 1 | 0 | -1 | ... |
| 1. Last_position_X Last_position_Y | | | | | | | | 2 1 | |
| 2. Significance Map | 1 | 0 | 1 | 1 | 1 | 1 | 0 | | |
| 3. Greater_than_1 | 1 | | 1 | 1 | 1 | 0 | | | |
| Greater_than_2 | 1 | | 1 | 1 | 0 | | | | |
| Sign Information | + | | + | − | + | + | | − | |
| Absolute -3 | 1 | | 0 | 0 | | | | | |

→ * Coefficients are coded in reverse scanning order

FIG. 2
(background)

(background)

Decoder processing using high throughput binarization mode

| sign | Abs (coefficient[i]) | Input |
|---|---|---|
| + | 1 | 0 |
| - | 1 | 1 |
| + | 2 | 2 |
| - | 2 | 3 |
| + | 3 | 4 |
| - | 3 | 5 |
| + | 4 | 6 |
| - | 4 | 7 |
| ... | ... | ... |

Mapping Table for Input Value input = (abs (coefficient[i])-1)<<1 + sign
(sign +:0, -:1)

FIG. 9

| Input value | Codeword (VLC-Table0) | Codeword (VLC-Table1) | Codeword (VLC-Table2) | Codeword (VLC-Table3) | Codeword (VLC-Table4) |
|---|---|---|---|---|---|
| 0 | 1 | 10 | 100 | 1000 | 10000 |
| 1 | 01 | 11 | 101 | 1001 | 10001 |
| 2 | 001 | 010 | 110 | 1010 | 10010 |
| 3 | 0001 | 011 | 111 | 1011 | 10011 |
| 4 | 00001 | 0010 | 0100 | 1100 | 10100 |
| 5 | 000001 | 0011 | 0101 | 1101 | 10101 |
| 6 | 0000001 | 00010 | 0110 | 1110 | 10110 |
| 7 | 00000001 | 00011 | 0111 | 1111 | 10111 |
| 8 | 000000001 | 000010 | 00100 | 01000 | 11000 |
| 9 | 0000000001 | 000011 | 00101 | 01001 | 11001 |
| 10 | 00000000001 | 0000010 | 00110 | 01010 | 11010 |
| 11 | 000000000001 | 0000011 | 00111 | 01011 | 11011 |
| 12 | 0000000000001 | 00000010 | 000100 | 01100 | 11100 |
| ... | ... | ... | ... | ... | ... | if (input > (Table[vlc])) vlc ++;
  where Table[VLC] = {3,5,13,27};
'vlc' represents the current vlc table number and stop 'vlc'
table updating when vlc is equal to 4

FIG. 10

(background)

| Scanning Position | 0 | 1 | 2 | 3 | 4 | 5 | 6 | 7 | ... | 15 |
|---|---|---|---|---|---|---|---|---|---|---|
| Coefficient Level | 4 | 0 | 3 | -3 | 2 | 1 | 0 | -1 | ... | 0 |
| 1. Significance Map | 1 | 0 | 1 | 1 | 1 | 1 | 0 | 1 | ... | 0 |

\* Coefficients are coded in reverse scanning order

FIG. 14

LOSSLESS CODING TECHNIQUE FOR CABAC IN HEVC

This application is a continuation-in-part of U.S. patent application Ser. No. 13/354,272 filed on Jan. 19, 2012 and entitled "HIGH THROUGHPUT BINARIZATION MODE (HTB) METHOD FOR CABAC IN HEVC", which is incorporated by reference herein in its entirety.

TECHNICAL FIELD

The present disclosure relates generally to electronic devices. More specifically, the present disclosure relates to electronic devices utilizing enhanced Context Adaptive Binary Arithmetic Coding (CABAC) for lossless encoding and/or decoding.

BACKGROUND

Many decoders (and encoders) receive (and encoders provide) encoded data for blocks of an image. Typically, the image is divided into blocks and each of the blocks is encoded in some manner, such as using a discrete cosine transform (DCT), and provided to the decoder. A block may denote a rectangular region in an image and consist of pixels, for example a 16×16 block is a region 16× pixels in width and 16× pixels in height. The decoder receives the encoded blocks and decodes each of the blocks in some manner, such as using an inverse discrete cosine transform.

Video coding standards, such as MPEG-4 part 10 (H.264), compress video data for transmission over a channel with limited frequency bandwidth and/or limited storage capacity. These video coding standards include multiple coding stages such as intra prediction, transform from spatial domain to frequency domain, quantization, entropy coding, motion estimation, and motion compensation, in order to more effectively encode and decode frames.

The Joint Collaborative Team on Video Coding (JCT-VC) of the International Telecommunication Union Telecommunication Standardization Sector (ITU-T) Study Group 16 (SG16) Working Party 3 (WP3) and International Organization for Standardization/International Electrotechnical Commission (ISO/IEC) Joint Technical Committee 1/Subcommittee 29/Working Group 11 (JTC1/SC29/WG11) has launched a standardization effort for a video coding standard called the High Efficiency Video Coding standard (HEVC). Similar to some prior video coding standards, HEVC is block-based coding. An example of a known HEVC encoder is shown in FIG. 1. HEVC decoders are also known.

In HEVC, Context-Adaptive Binary Arithmetic Coding (CABAC) is used to compress Transformed and Quantized Coefficients (TQCs) without loss. The TQCs are determined at the encoder by processing image blocks with a forward transform to generate transform coefficients that are then quantized using an operation that maps multiple transform coefficient values to TQCs values. The TQCs values are then communicated to the decoder as Coefficient Level values, or level values, and the level value for each coefficient is then mapped to a transform coefficient value that is similar, but not necessarily identical to, the transform coefficient value computed at the encoder. CABAC based encoding and/or decoding technique is generally context adaptive which refers to (i) adaptively coding symbols based on the values of previous symbols encoded and/or decoded in the past, and (ii) context, which identifies the set of symbols encoded and/or decoded in the past used for adaptation. The past symbols may be located in spatial and/or temporal adjacent blocks. In many cases, the context is based upon symbol values of neighboring blocks.

As mentioned above, CABAC may be used to compress TQCs without loss. By way of background, TQCs may be from different block sizes according to transform sizes (e.g., 4×4, 8×8, 16×16, 32×32, 16×32). Two-dimensional (2D) TQCs may be converted into a one-dimensional (1D) array before entropy coding. In an example, 2D arrayed TQCs in a 4×4 block may be arranged as illustrated in Table (1).

TABLE (1)

| 4  | 0 | 1  | 0   |
|----|---|----|-----|
| 3  | 2 | −1 | ... |
| −3 | 0 | ...| ... |
| 0  |...| ...| ... |

When converting the 2D TQCs into a 1D array, the block may be scanned in a diagonal zig-zag fashion. Continuing with the example, the 2D arrayed TQCs illustrated in Table (1) may be converted into 1D arrayed TQCs [4, 0, 3, −3, 2, 1, 0, −1, 0, . . . ] by scanning the first row and first column, first row and second column, second row and first column, third row and first column, second row and second column, first row and third column, first row and fourth column, second row and third column, third row and second column, fourth row and first column and so on.

The 1D array of TQCs is represented by a sequence of Syntax Elements (SEs) in CABAC. An example of the sequence of SEs for the example 1D array of TQCs is shown in FIG. 2. The SEs represent the following parameters: Last position X/Y, Significance Map, and the attributes Greater than 1, Greater than 2, Sign Information, and Absolute −3. The last position X/Y represents the position (X/Y) of the last non-zero coefficient in the corresponding block. Significance map represents the significance of each coefficient. Greater than 1 indicates whether the coefficient amplitude is larger than one for each non-zero coefficient (i.e. with significant flag as 1). Greater than 2 indicates whether the coefficient amplitude is larger than two for each coefficient with amplitude larger than one (i.e. with greater than 1 flag as 1).

In CABAC in HEVC, the representative SEs are coded. FIG. 3 shows the CABAC framework used for coding SEs. The CABAC coding technique includes coding symbols using stages. In the first stage, the CABAC uses a "binarizer" to map input symbols to a string of binary symbols, or "bins". The input symbol may be a non-binary valued symbol that is binarized or otherwise converted into a string of binary (1 or 0) symbols prior to being coded into bits. The bins can be coded into bits using either a "bypass encoding engine" or a "regular encoding engine".

For the regular encoding engine in CABAC, in the second stage a probability model is selected. The probability model is used to arithmetic encode one or more bins of the binarized input symbols. This model may be selected from a list of available probability models depending on the context, which is a function of recently encoded symbols. The probability model stores the probability of a bin being "1" or "0". In the third stage, an arithmetic encoder encodes each bin according to the selected probability model. There are two sub-ranges for each bin, corresponding to a "0" and a "1". The fourth stage involves updating the probability model. The selected probability model is updated based on the actual encoded bin value (e.g., if the bin value was a "1", the frequency count of the "1"s is increased). The decoding technique for CABAC decoding reverses the process.

For the bypass encoding engine in CABAC, the second stage involves conversion of bins to bits omitting the computationally expensive context estimation and probability update stages. The bypass encoding engine assumes a fixed probability distribution for the input bins. The decoding technique for CABAC decoding reverses the process.

The CABAC encodes the symbols conceptually using two steps. In the first step, the CABAC performs a binarization of the input symbols to bins. In the second step, the CABAC performs a conversion of the bins to bits using either the bypass encoding engine or the regular encoding engine. The resulting encoded bit values are provided in the bitstream to a decoder.

The CABAC decodes the symbols conceptually using two steps. In the first step, the CABAC uses either the bypass decoding engine or the regular decoding engine to convert the input bits to bin values. In the second step, the CABAC performs de-binarization to recover the transmitted symbol value for the bin values. The recovered symbol may be non-binary in nature. The recovered symbol value is used in remaining aspects of the decoder.

As previously described, the encoding and/or decoding process of the CABAC includes at least two different modes of operation. In a first mode, the probability model is updated based upon the actual coded bin value, generally referred to as a "regular coding mode". The regular coding mode requires several sequential serial operations together with its associated computational complexity and significant time to complete. In a second mode, the probability model is not updated based upon the actual coded bin value, generally referred to as a "bypass coding mode". In the second mode, there is no probability model (other than perhaps a fixed probability) for decoding the bins, and accordingly there is no need to update the probability model.

When utilizing CABAC coding in HEVC, throughput performance can differ depending on different factors such as but not limited to: total number of bins/pixels, number of bypass bins/pixels, and number of regular (or context) coded bins/pixels. Generally speaking, throughput for the case of high bit-rate encoding (low Quantization Parameter (QP) value) is significantly less than throughput in other cases. Therefore, throughput in high bit-rate cases may consume a significant amount of processing resources and/or may take a significant amount of time to encode/decode. The disclosure that follows solves this and other problems.

It is also known that CABAC can be used in a lossless coding mode to compress a residual sample. In one example, a residual sample is a value corresponding to a specific location in an image. Typically, a residual sample corresponds to the difference between a value corresponding to a specific location in an image and a prediction value corresponding to the same, specific location in an image. Alternatively, a residual sample is a value corresponding to a specific location in an image that has not been processed with a transformation operation, or a transformation operation that is not typically used to create TQCs. A residual sample can be from different block sizes according to its sample size (4×4, 8×8, 16×16, 32×32, 16×32, etc.) A 2D residual sample block is first converted into a 1D array before entropy coding, similar to TQC encoding. In an example, 2D arrayed residual sample in a 4×4 block may be arranged as illustrated in Table (2).

TABLE (2)

| 4 | 0 | 1 | 0 |
|---|---|---|---|
| 3 | 2 | −1 | ... |
| −3 | 0 | ... | ... |
| 0 | ... | ... | ... |

TABLE (2)-continued

When converting the 2D residual sample into a 1D array, the block may be scanned in a diagonal zig-zag fashion. Continuing with the example, the 2D arrayed residual sample illustrated in Table (2) may be converted into 1D arrayed residual sample [4, 0, 3, −3, 2, 1, 0, −1, 0, . . . ] by scanning the first row and first column, first row and second column, second row and first column, third row and first column, second row and second column, first row and third column, first row and fourth column, second row and third column, third row and second column, fourth row and first column and so on.

The 1D array of the residual sample is represented by a sequence of Syntax Elements (SEs) in CABAC. An example of a sequence of SEs for the example 1D array of the residual sample is shown in FIG. 11. The SEs represent the following parameters: Last position X/Y, Significance Map, and the attributes Greater than 1, Greater than 2, Sign Information, and Absolute −3.

In the lossless coding mode of CABAC in HEVC, the representative SEs are coded. The CABAC framework of FIG. 3 may be used for coding the SEs. The CABAC coding technique includes coding symbols using stages. In the first stage, the CABAC uses a "binarizer" to map input symbols to a string of binary symbols, or "bins". The input symbol may be a non-binary valued symbol that is binarized or otherwise converted into a string of binary (1 or 0) symbols prior to being coded into bits. The bins can be coded into bits using the previously described "regular encoding engine".

For the regular encoding engine in the lossless coding mode of CABAC, in the second stage a probability model (also known as a "context model" in the lossless encoding mode of CABAC) is selected. The model is used to arithmetic encode one or more bins of the binarized input symbols. This model may be selected from a list of available models depending on the context, which is a function of recently encoded symbols. The model stores the probability of a bin being "1" or "0". In the third stage, an arithmetic encoder encodes each bin according to the selected model. There are two sub-ranges for each bin, corresponding to a "0" and a "1". The fourth stage involves updating the model. The selected model is updated based on the actual encoded bin value (e.g., if the bin value was a "1", the frequency count of the "1"s is increased). The decoding technique for CABAC decoding reverses the process.

The number of models used as described in the previous paragraph may be 184. Specifically: 36 models used for Last position X/Y (18 models for Last_pos_X, 18 models for Last_pos_Y); 48 models used for Significance Map (4×4 block: 9 luma, 6 chroma; 8×8 block: 11 luma, 11 chroma; 16×16 or 32×32 block: 7 luma, 4 chroma); and 100 models used for the attributes Greater than 1, Greater than 2, Sign Information, and Absolute −3 (Greater_than_1 flag of luma: 30; Greater_than_1 flag of chroma 20, Greater_than_2 flag of luma: 30; and Greater_than_2 flag of chroma 20).

When utilizing CABAC encoding in HEVC in the lossless coding mode, encoding/decoding is computationally complex. One reason for the computation complexity is the use of 184 models, as explained above. Due to this computation complexity, encoding/decoding may consume a significant amount of processing resources and/or may take a significant amount of time to complete. The disclosure that follows solves this and other problems.

BRIEF DESCRIPTION OF THE DRAWINGS

FIG. 2 is a table showing a sequence of syntax elements according to CABAC.

FIG. 9 illustrates a mapping table that may be used for determining an input value in high throughput binarization mode.

FIG. 10 illustrates a plurality of binarization tables that may be used for adaptive binarization in high throughput binarization mode.

FIG. 14 is a table showing a sequence of syntax elements according to the configuration illustrated in FIG. 13.

DETAILED DESCRIPTION

Figure 1:
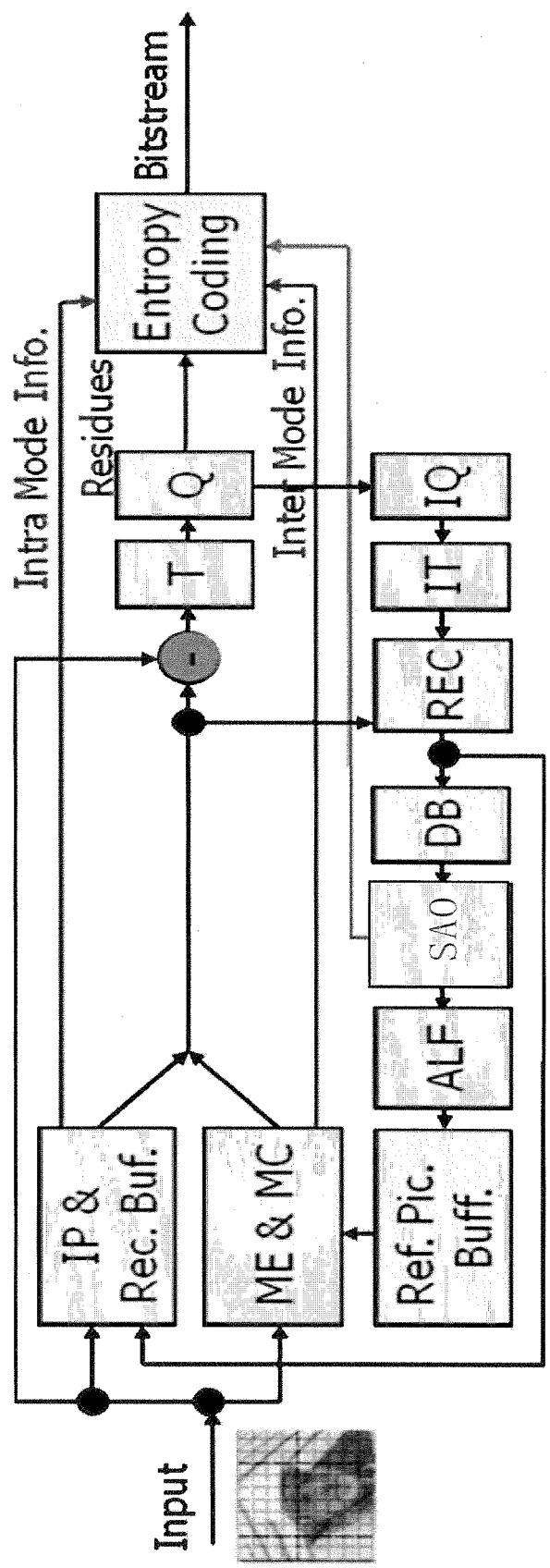
FIG. 1 is a block diagram of an HEVC encoder.
Figure 3:
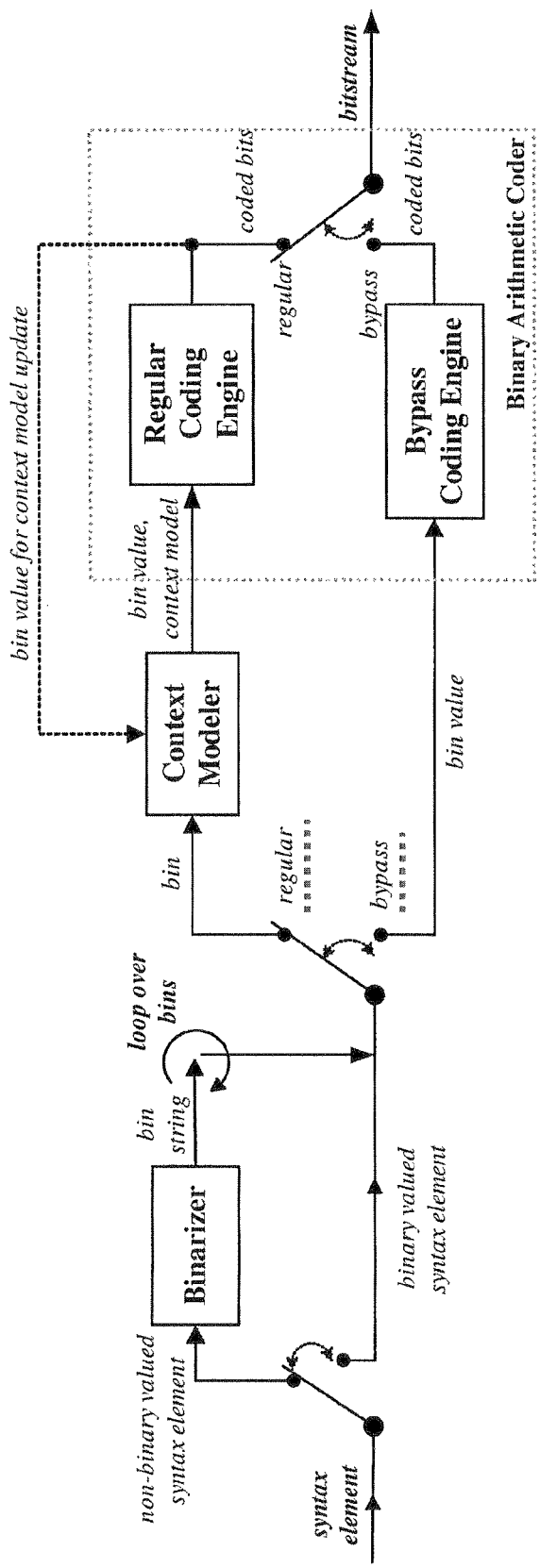
FIG. 3 is a block diagram of the CABAC framework for a sequence of syntax elements.
Figure 4:
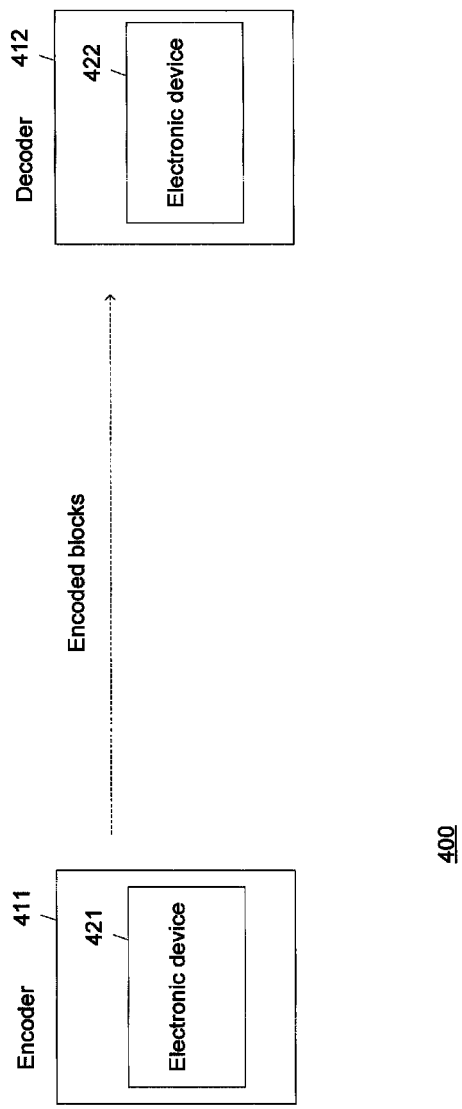
FIG. 4 is a block diagram illustrating an example of an encoder and a decoder.

FIG. 4 is a block diagram illustrating an example of an encoder and a decoder.

The system 400 includes an encoder 411 to generate encoded blocks to be decoded by a decoder 412. The encoder 411 and the decoder 412 may communicate over a network.

The encoder 411 includes an electronic device 421 configured to encode using high throughput binarization mode. The electronic device 421 may comprise a processor and memory in electronic communication with the processor, where the memory stores instructions being executable by the processor to perform the operations shown in FIGS. 5 and 6.

The decoder 412 includes an electronic device 422 configured to decode using the high throughput binarization mode. The electronic device 422 may comprise a processor and memory in electronic communication with the processor, where the memory stores instructions being executable to perform the operations shown in FIGS. 7 and 8.

Figure 5:
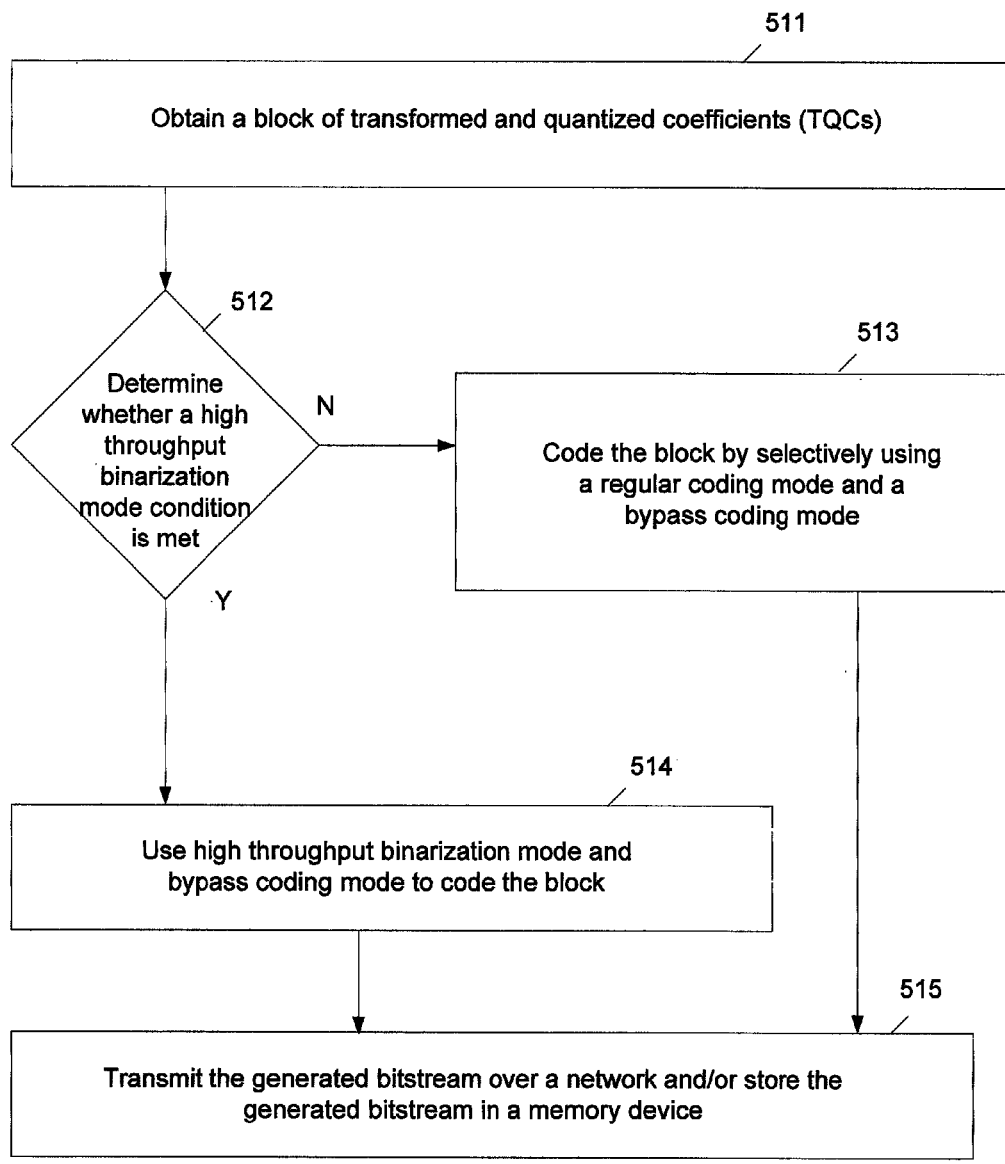
FIG. 5 is a flow diagram illustrating one configuration of a method for high throughput binarization mode on an electronic device.

FIG. 5 is a flow diagram illustrating one configuration of a method for high throughput binarization mode on an electronic device.

In block 511, the electronic device 421 obtains a block of transformed and quantized coefficients (TQCs). In diamond 512, the electronic device 421 determines whether a high throughput binarization mode condition is met. If the condition is not met in diamond 512, then in block 513 the electronic device 421 codes the block by selectively using a regular coding mode and a bypass coding mode (according to conventional CABAC selection schemes).

If the condition is met in diamond 512, then in block 514 the electronic device 421 uses high throughput binarization mode and bypass coding mode to code the block. The electronic device 421 transmits the generated bitstream over a network and/or stores the generated bitstream in a memory device in block 515.

HTB mode uses bypass coding mode for coding the level values. In contrast to regular encoding mode, bypass coding omits the computationally expensive context estimation and probability update stages because bypass coding mode assumes a fixed probability distribution for the input bins.

In addition to using bypass coding mode for coding, by way of contrast to conventional CABAC, HTB mode uses simplified signing structure for coding. For example, conventional CABAC requires four sub-parts for coding, including Greater_than_1, Greater_than_2, Sign information, and Absolute −3.

Figure 6:
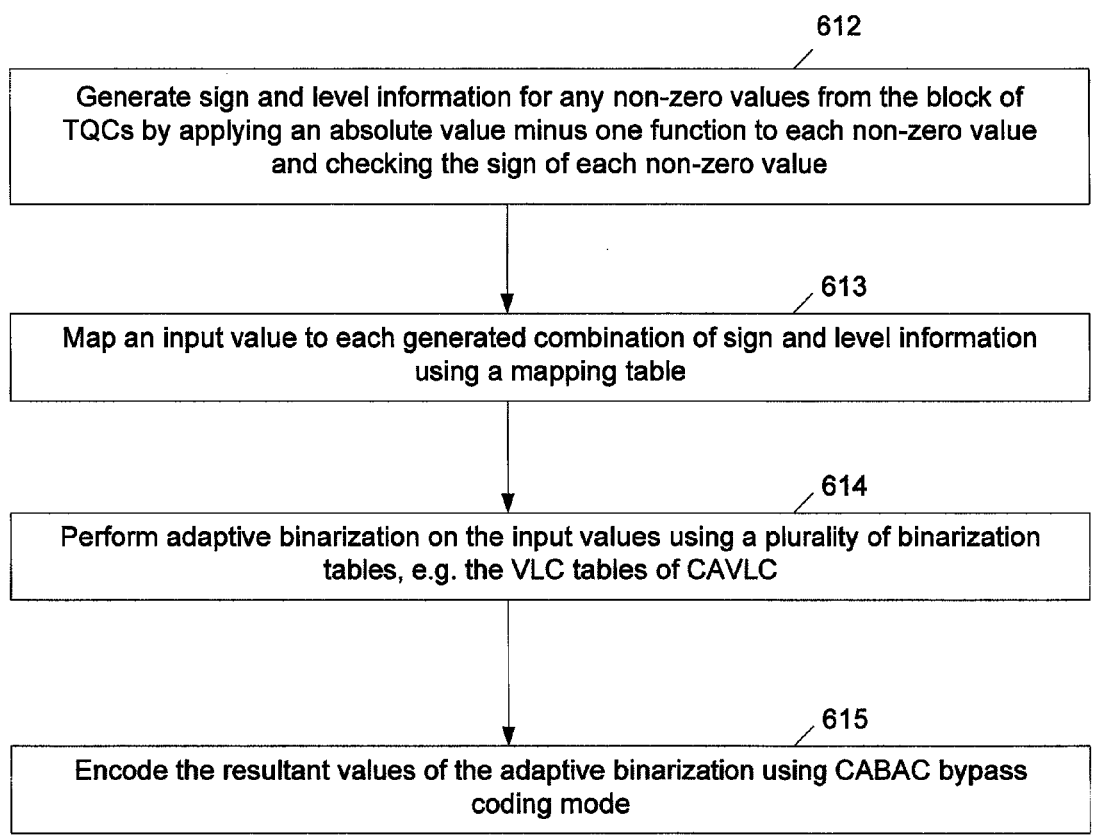
FIG. 6 is a flow diagram illustrating one configuration of encoder processing using high throughput binarization mode.

FIG. 6 is a flow diagram illustrating one configuration of encoder processing using high throughput binarization mode.

The blocks 612-615 illustrate operations performed in block 514 in more detail. In block 612, the electronic device 421 generates sign and level information for any non-zero values from the block of TQCs by applying an absolute value minus one function to each non-zero value and checking the sign of each non-zero value. For ease of explanation, consider the values for the 1D arrayed TQC from the background section of the present application [4, 0, 3, −3, 2, 1, 0, −1, 0, . . . ]. Applying the absolute value minus one function to each non-zero value and checking the sign of each non-zero value generates six combinations of sign and level information as follows: +3, +2, −2, +1, +0, and −0.

In block 613, the electronic device 421 maps an input value to each generated combination of sign and level information using a mapping table. An example mapping table is shown in FIG. 9. FIG. 9 also shows an equation for determining an input value according to blocks 612 and 613.

In block 614, the electronic device 421 performs adaptive binarization of the input values using a plurality of binarization tables, e.g. the VLC tables of Context Adaptive Variable Length Coding (CAVLC). An example of the VLC tables of CAVLC is shown in FIG. 10. FIG. 10 also shows an equation for updating the binarization tables based on previous input information.

In an example, block 614 may include initially using values from the column VLC-Table-0 (FIG. 10) to binarize at least the first input value. The VLC table number may be monotomically increased when a previous value is larger than the given threshold values, e.g. 3, 5, 13, 27. Accordingly, subsequent adaptive binarization after the first monotomical increase may use values from the column VLC-Table-1, subsequent adaptive binarization after the second monotomical increase may use values from the column VLC-Table-2, etc.

In block 615, the electronic device 421 encodes the resultant values of the adaptive binarization using the CABAC bypass coding mode.

High Throughput Binarization Mode Condition

In an example, if a characteristic corresponding to a block of image data is greater than a preset threshold, then the high throughput binarization mode condition is met, e.g. the electronic device 421 may set a high throughput binarization mode indicator, e.g. an HTB mode flag, to a value of 1 (which of course may include changing a default value of the HTB mode flag or leaving the HTB mode flag at a default value depending on design preference).

In an example, the electronic device 421 determines whether a bit rate for a coding is greater than a preset threshold. If the bit rate is greater than the preset threshold, then the high throughput binarization mode condition is met. In an example, the preset bit rate threshold corresponds to QP 16; however, a preset threshold corresponding to different QP values may be used.

In an example, the determination (by the electronic device 421 or the electronic device 422) of whether the high throughput binarization mode condition is met is based on whether the transform unit level (for example but not limited to the level values generated by a transform unit) of a corresponding block of image data is greater than a preset threshold.

In an example, the high throughput binarization mode condition can be met when the number of level values of a corresponding block of image data and with magnitude greater than zero is greater than a preset threshold, e.g. 8. In another example, the high throughput binarization mode condition is met when the number of level values of a corresponding block of image data and with magnitude greater than a first preset threshold is greater than a second preset threshold. In yet an example, the high throughput binarization mode condition is met when a level value of a corresponding block of image data is greater than a preset threshold.

Figure 20A:
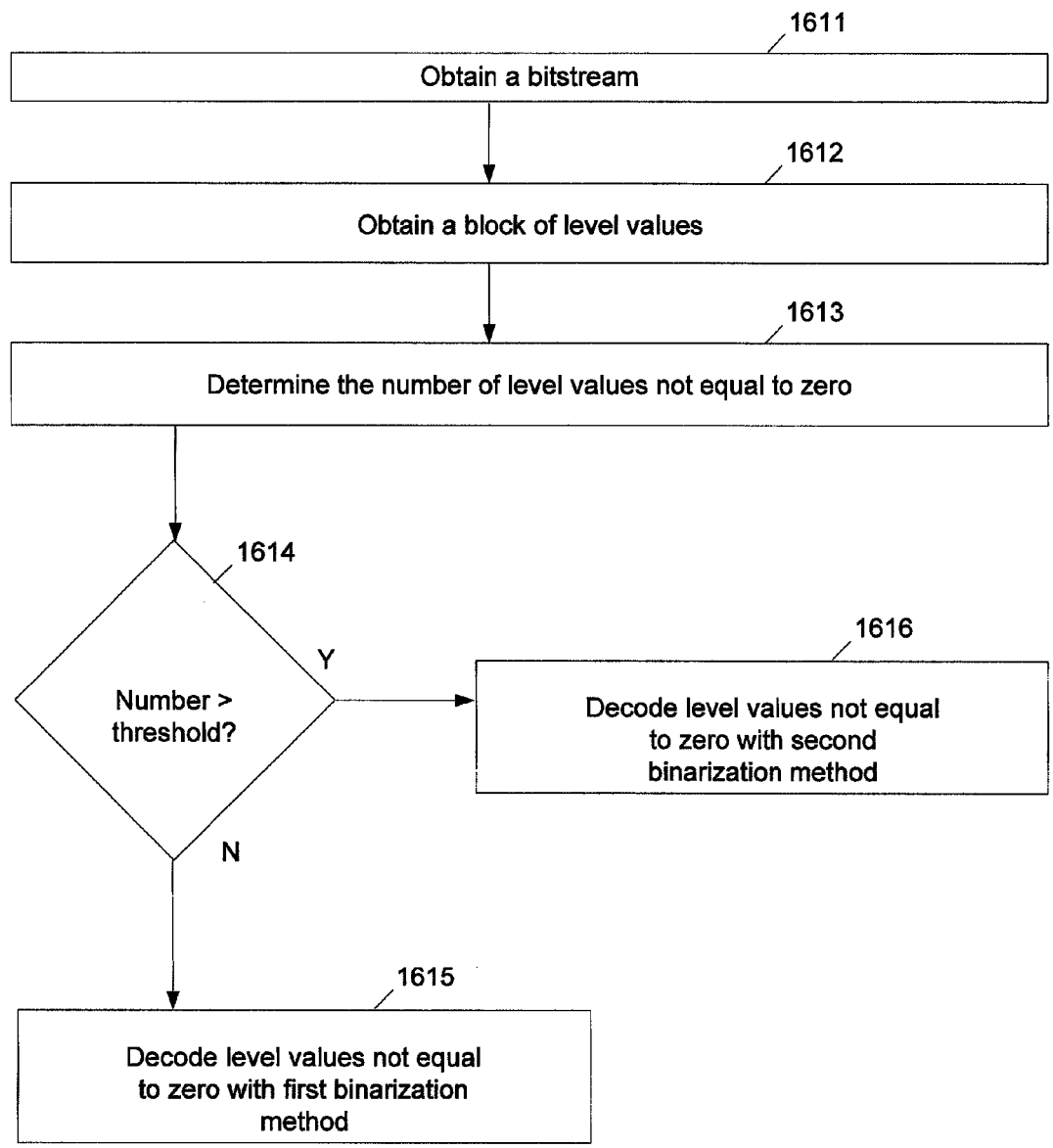
FIGS. 20A-E are flow diagrams illustrating example configurations of an encoder or a decoder to determine whether the high throughput binarization mode condition is met.
Figure 20B:
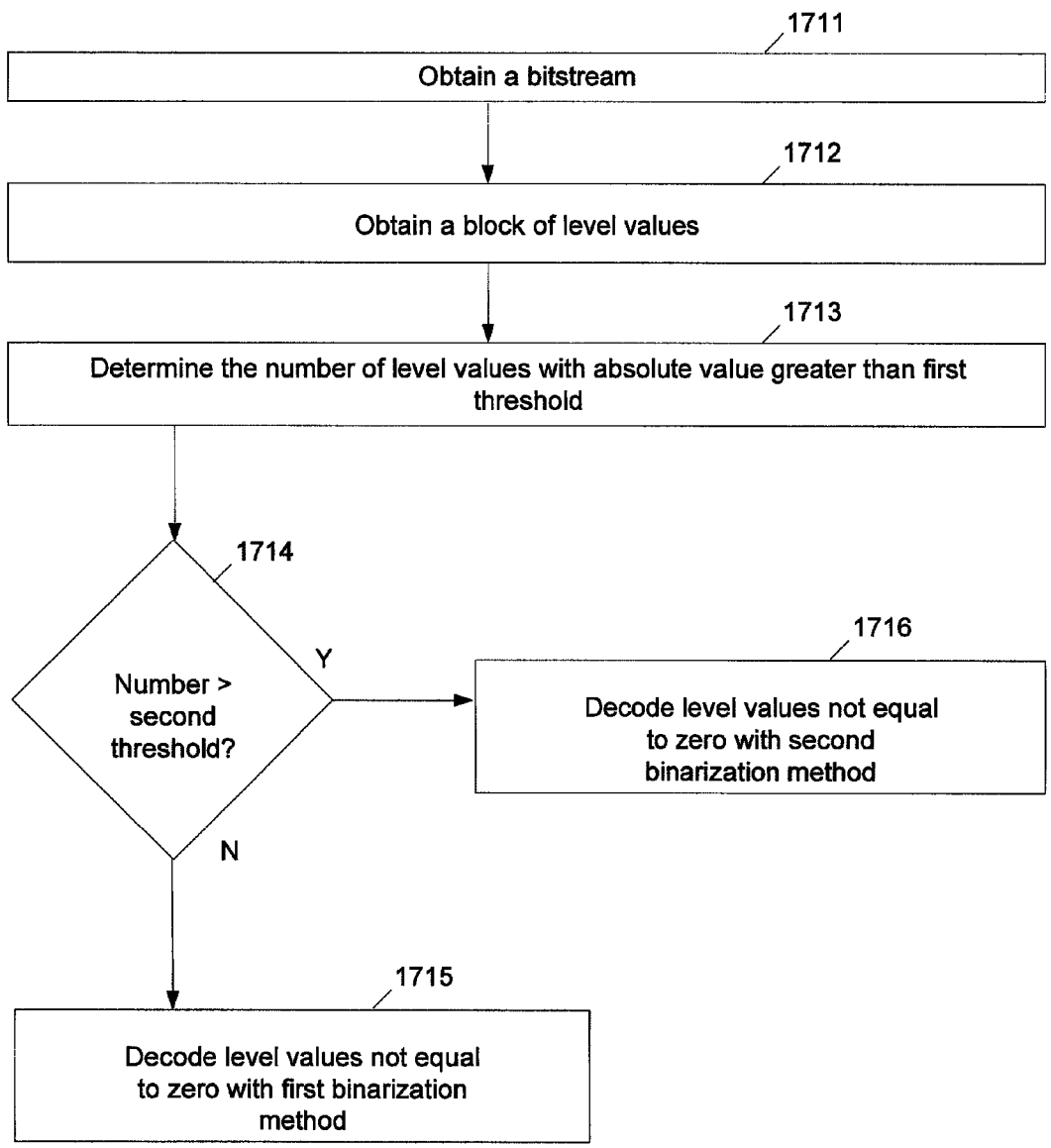
Figure 20C:
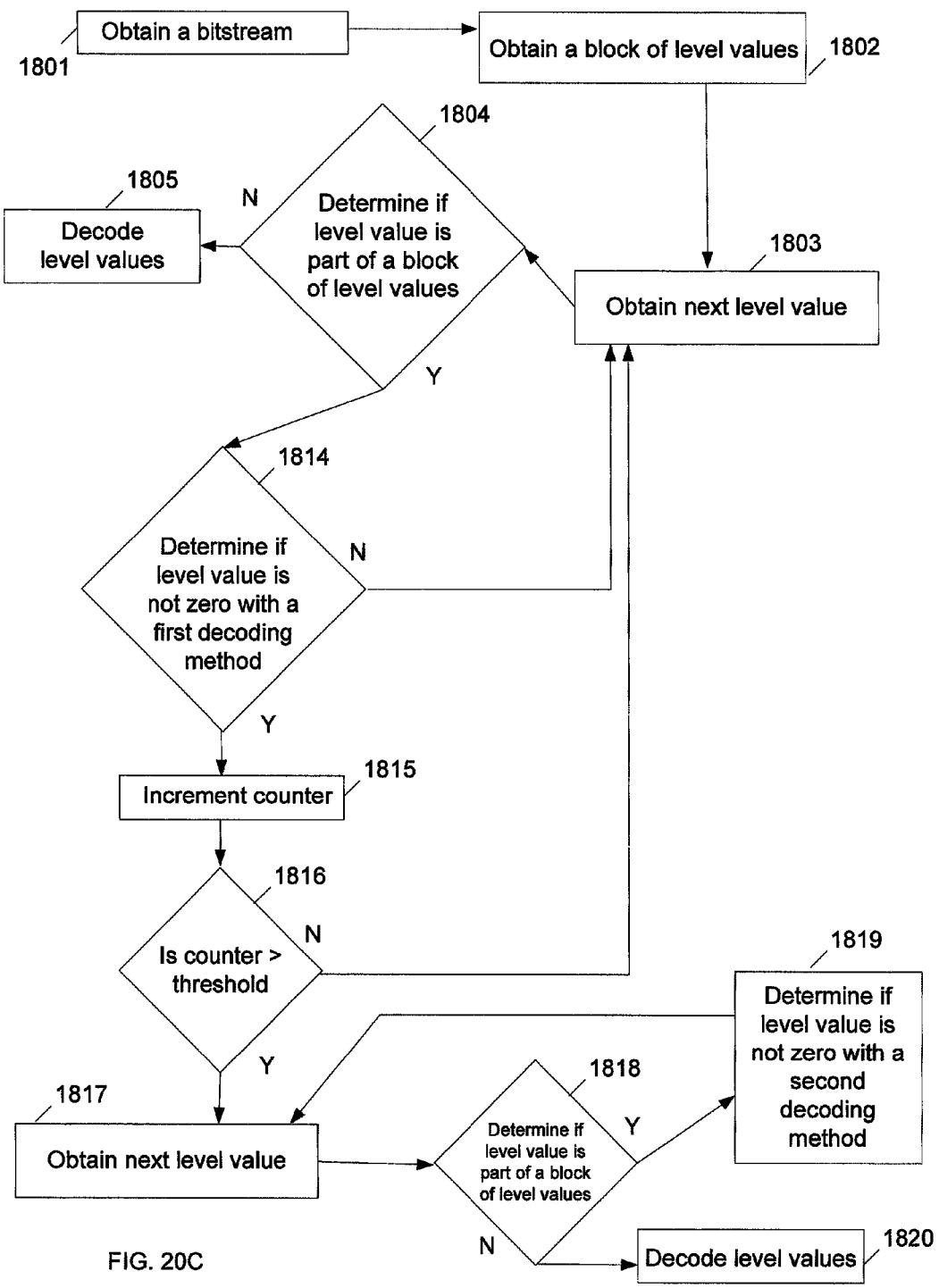
Figure 20D:
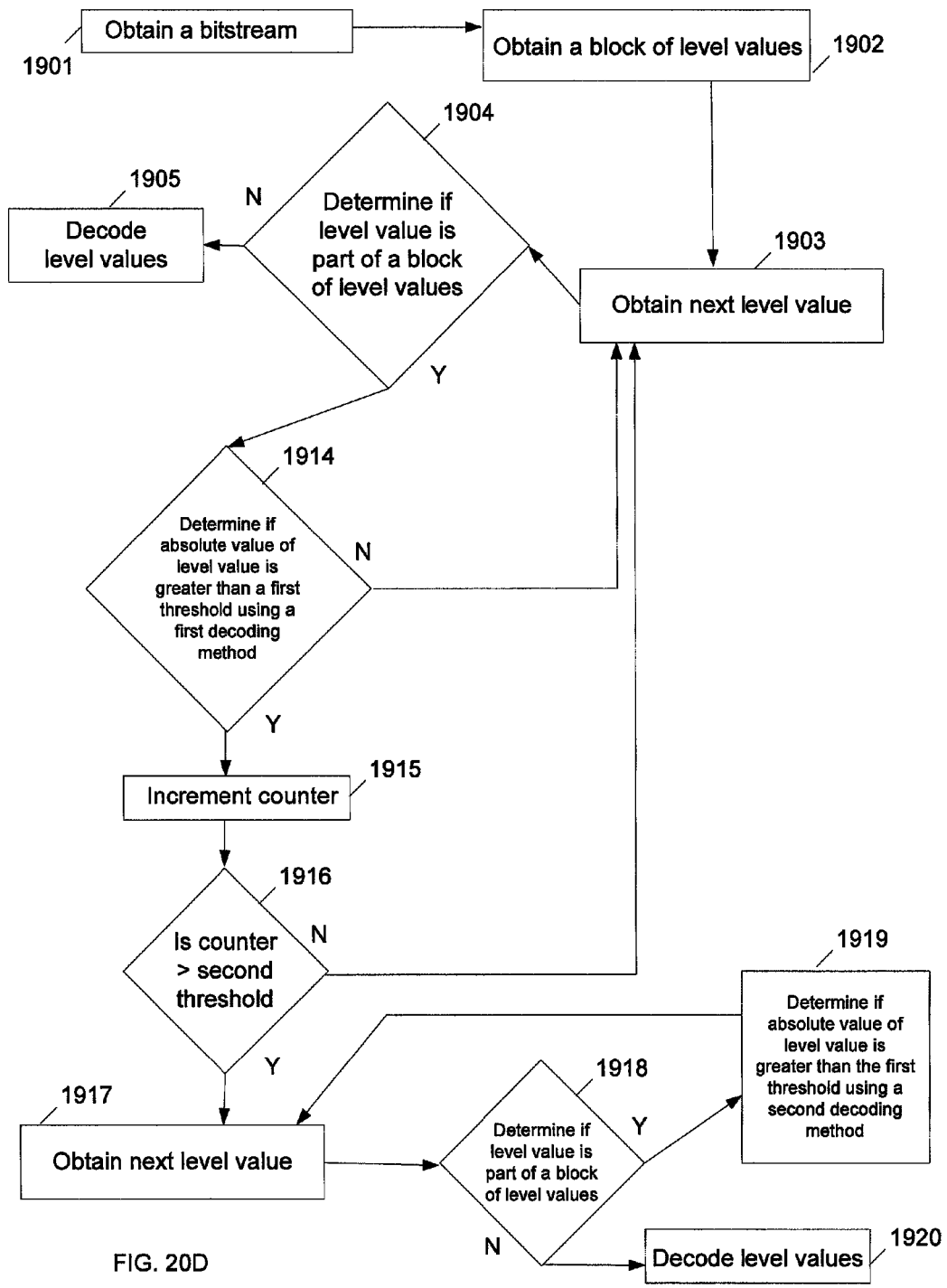
Figure 20E:
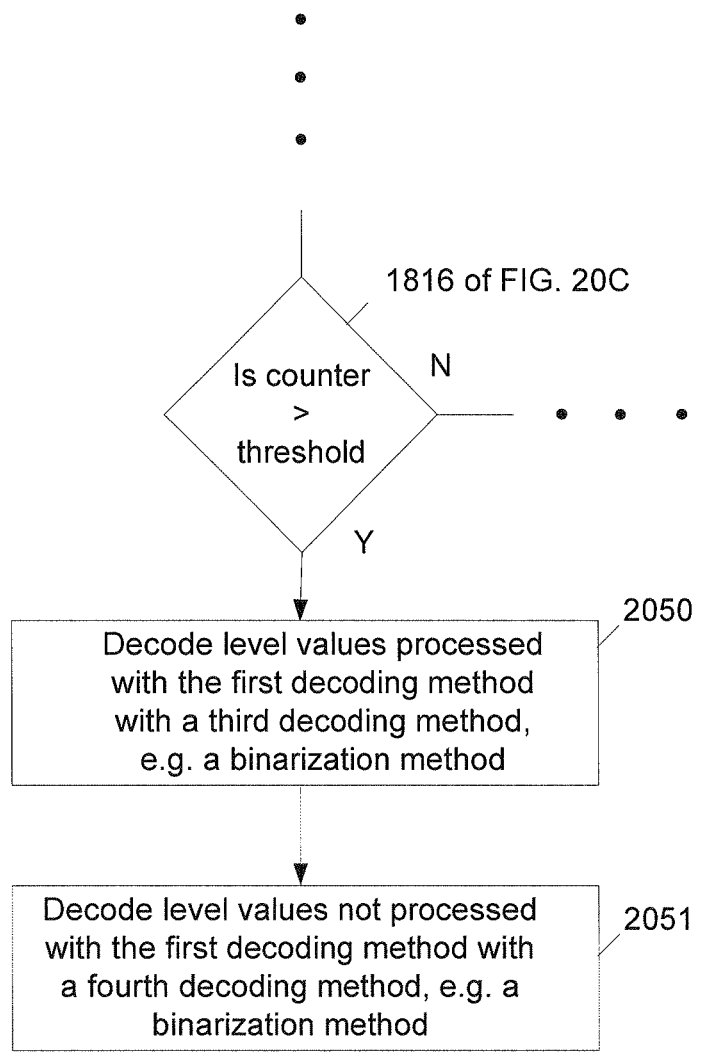

The FIGS. 20A-E show some examples of configurations that may be used for an encoder or decoder in example systems operating according to at least some of the principles described in the immediately preceding two paragraphs. FIG. 20A illustrates processes 1611-1616, as shown. FIG. 20B illustrates processes 1711-1716, as shown. FIG. 20C illustrates processes 1801-1805 and 1814-1820. FIG. 20D illustrates processes 1901-1905 and 1914-1920. In FIG. 20E, the processes of FIG. 20C are performed up until process 1816, as shown. If the counter is greater than the threshold in process 1816, then the configuration continues as shown in FIG. 20E.

In an example, the determination (by the electronic device 421 or the electronic device 422) of whether the high throughput binarization mode condition is met is based on whether the slice level of a corresponding block of image data is greater than a preset threshold.

High Throughput Binarization Mode Indicator

In an example, the electronic device 421 is configured to set a high throughput binarization indicator, e.g. an HTB mode flag, in a header, e.g. the slice header. The high throughput binarization indicator may be used to determine whether or not the process shown in FIG. 5 is executed for block(s) corresponding to the slice header.

In an example, setting the HTB mode flag to "1" causes the electronic device 421 to perform the process shown in the flowchart of FIG. 5 for block(s) corresponding to the slice header in response to observing the HTB mode flag value of "1". Setting the HTB mode flag to "0" causes the electronic device 421 to encode block(s) corresponding to the slice header according to a conventional CABAC technique in response to observing the HTB mode flag value of "0".

The HTB mode flag value may also be observed by the electronic device 422 for decoding. In an example, the electronic device 422 decodes block(s) corresponding to a slice header having the HTB mode flag value of "1" according to the process shown in the flowchart of FIG. 7 for block(s) corresponding to the slice header in response to observing the HTB mode flag value of "1". The electronic device 422 decodes block(s) corresponding to a slice header having the HTB mode flag value of "0" according to a conventional CABAC technique in response to observing the HTB mode flag value of "0".

Figure 7:
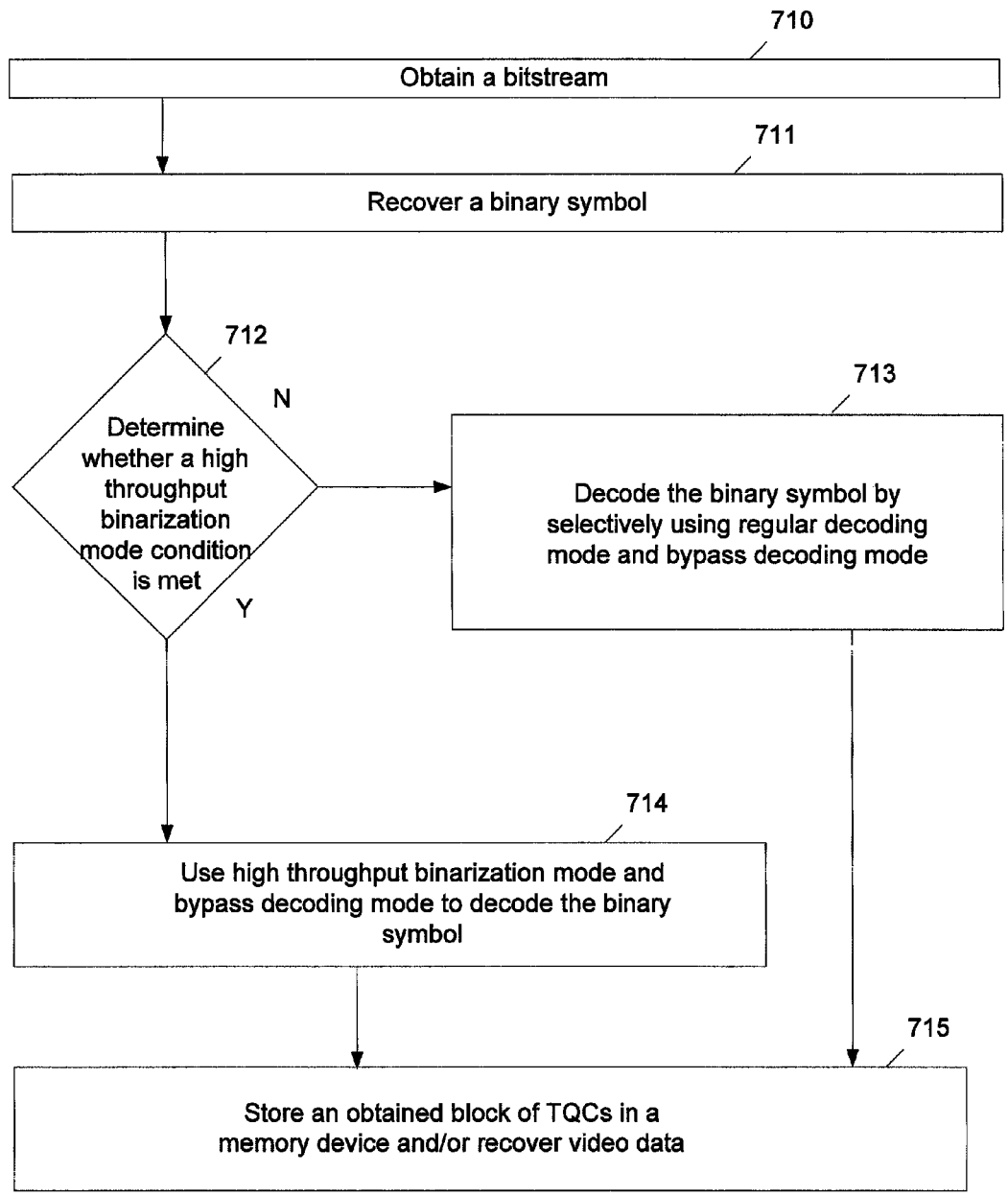
FIG. 7 is a flow diagram illustrating one configuration of a method for high throughput binarization mode on an electronic device at the decode-side.

FIG. 7 is a flow diagram illustrating one configuration of a method for high throughput binarization mode on an electronic device at the decode-side.

In block 710, the electronic device 422 obtains a bitstream. In block 711, the electronic device 422 recovers a binary symbol from the obtained bitstream.

In diamond 712, the electronic device 422 determines whether a high throughput binarization mode condition is met. In an example, the determination may include checking a header, such as a slice header, corresponding to the received bitstream. Checking the header may further comprise checking a slice header corresponding to the obtained bit stream for a value of a high throughput binarization mode indicator. If the condition is not met in diamond 712, then in block 713 the electronic device 422 decodes the binary symbol by selectively using regular decoding mode and bypass coding mode.

If the condition is met in diamond 712, then in block 714 the electronic device 421 uses high throughput binarization mode and bypass decoding mode to decode the binary symbol. The electronic device 422 may store an obtained block of TQCs in a memory device and/or may recover video data in block 715.

Figure 8:
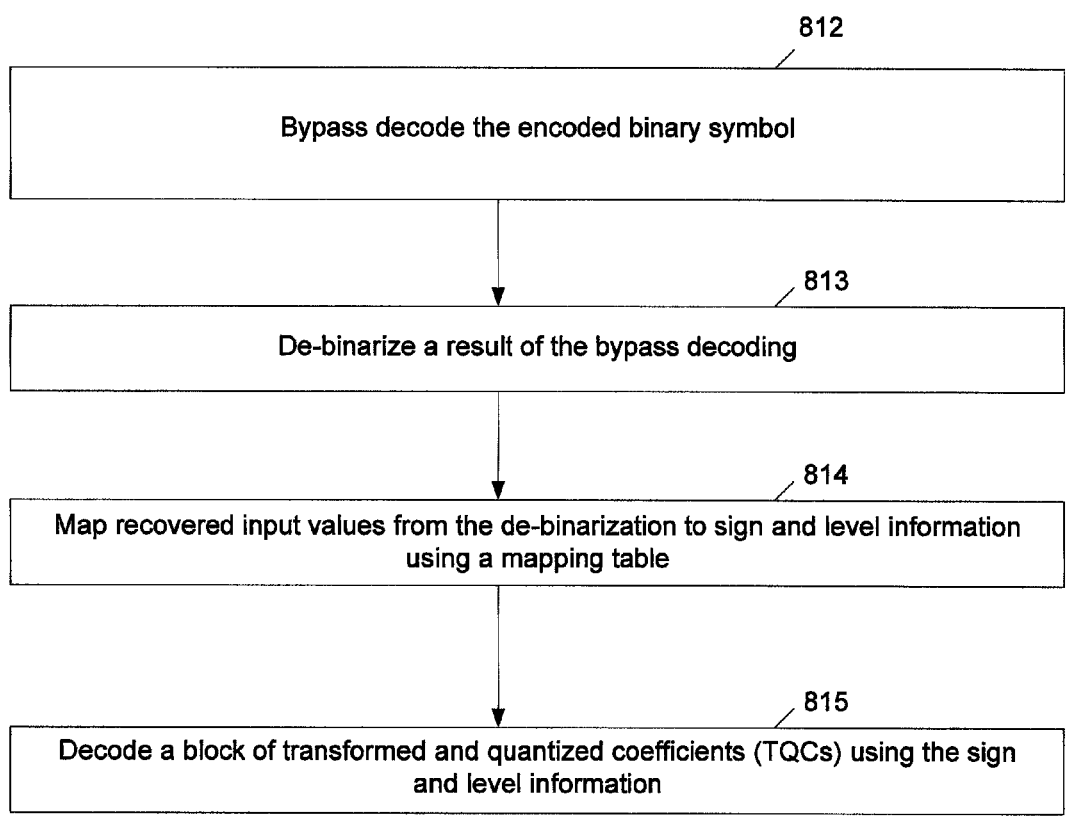
FIG. 8 is a flow diagram illustrating one configuration of decoder processing using high throughput binarization mode.

FIG. 8 is a flow diagram illustrating one configuration of decoder processing using high throughput binarization mode.

The blocks 812-815 illustrate operations performed in block 714 in more detail. In block 812, the electronic device 422 bypass decodes the encoded binary symbol. In block 813, the electronic device 422 de-binarizes a result of the bypass decoding. In block 814, the electronic device 422 maps recovered input values from the de-binarization to sign and level information using a mapping table. In block 815, the electronic device 422 decodes a block of transformed and quantized coefficients (TQCs) using the sign and level information.

In an example, an electronic device including a processor and a memory in electronic communication with the processor is provided. Stored in the memory are instructions executable by the processor to perform operations.

In an example, an operation may include obtaining a block of transformed and quantized coefficients (TQCs). Another operation may include determining whether a high throughput binarization mode condition is met. Another operation may include generating a first bitstream using the high throughput binarization mode in response to determining that the high throughput binarization mode condition is met. Another operation may include generating a second bitstream in response to determining that the high throughput binarization mode condition is not met. Another operation may include transmitting the generated first or second bitstream to a decoder.

In an example, the generation of the first bitstream using the high throughput binarization mode may include additional operations. One operation may include generating sign and level information for any non-zero values from the block by applying an absolute value minus one function to each non-zero value and checking the sign of each non-zero value. Another operation may include mapping an input value to each generated combination of sign and level information using a mapping table. Another operation may include performing adaptive binarization of the mapped input values using a plurality of binarization tables. Another operation may include encoding a result of the adaptive binarization.

In an example, the plurality of binarization tables include VLC tables of CAVLC. Encoding the result of the adaptive binarization may further include the operation of utilizing a CABAC bypassing coding mode.

In an example, the adaptive binarization of the mapped input values using a plurality of binarization tables may include additional operations. One operation may include determining whether one of the mapped input values is greater than a preset threshold. Another operation may include performing a table update responsive to determining that said mapped input value is greater than the preset threshold.

In an example, the generation of the first bitstream may include additional operations. One operation may include coding the block by selectively utilizing a regular coding mode and a bypass coding mode according to CABAC. Another operation may include generating the first bitstream utilizing only the bypass coding mode.

In an example, the determination of whether the high throughput binarization mode condition is met is based on whether a characteristic corresponding to a block of image data is greater than a preset threshold.

In an example, the determination of whether the high throughput binarization mode condition is met is based on whether the slice level of a corresponding block of image data is greater than a preset threshold.

In an example, the determination of whether the high throughput binarization mode condition is met is based on whether the transform unit level of a corresponding block of image data is greater than a preset threshold.

Lossless Coding Technique for CABAC in HEVC

Figure 12:
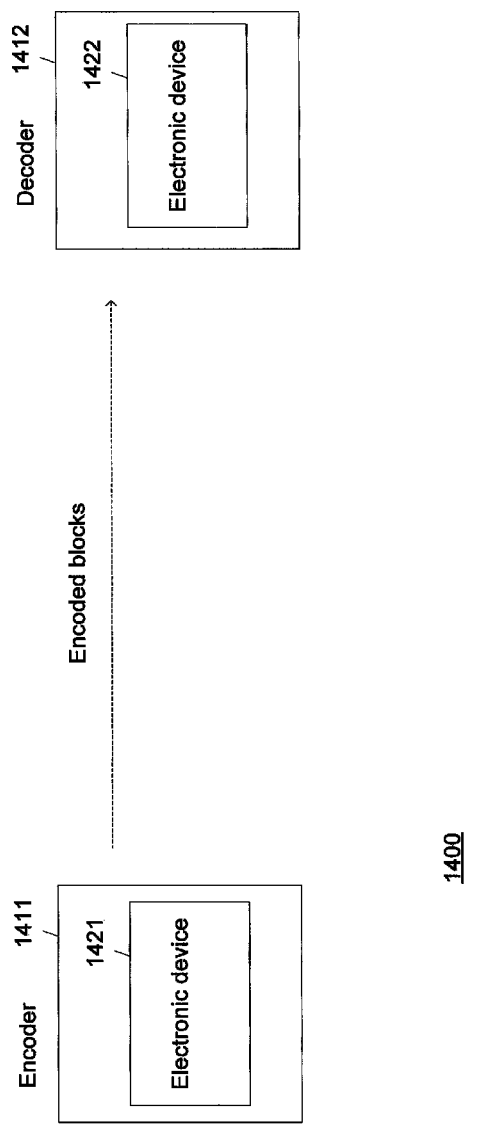
FIG. 12 is a block diagram illustrating an example of an encoder and a decoder for a lossless coding technique.

FIG. 12 is a block diagram illustrating an example of an encoder and a decoder for a lossless coding technique.

The system 1400 includes an encoder 1411 to generate encoded blocks to be decoded by a decoder 1412. The encoder 1411 and the decoder 1412 may communicate over a network.

The encoder 1411 includes an electronic device 1421 configured to encode using a lossless coding technique for CABAC in HEVC. The electronic device 1421 may comprise a processor and memory in electronic communication with the processor, where the memory stores instructions being executable by the processor to perform the operations shown in FIGS. 13, 16, and 18.

The decoder 1412 includes an electronic device 1422 configured to decode using a lossless coding technique for CABAC in HEVC. The electronic device 1422 may comprise a processor and memory in electronic communication with the processor, where the memory stores instructions being executable to perform the operations shown in FIGS. 15, 17, and 19.

Figure 13:
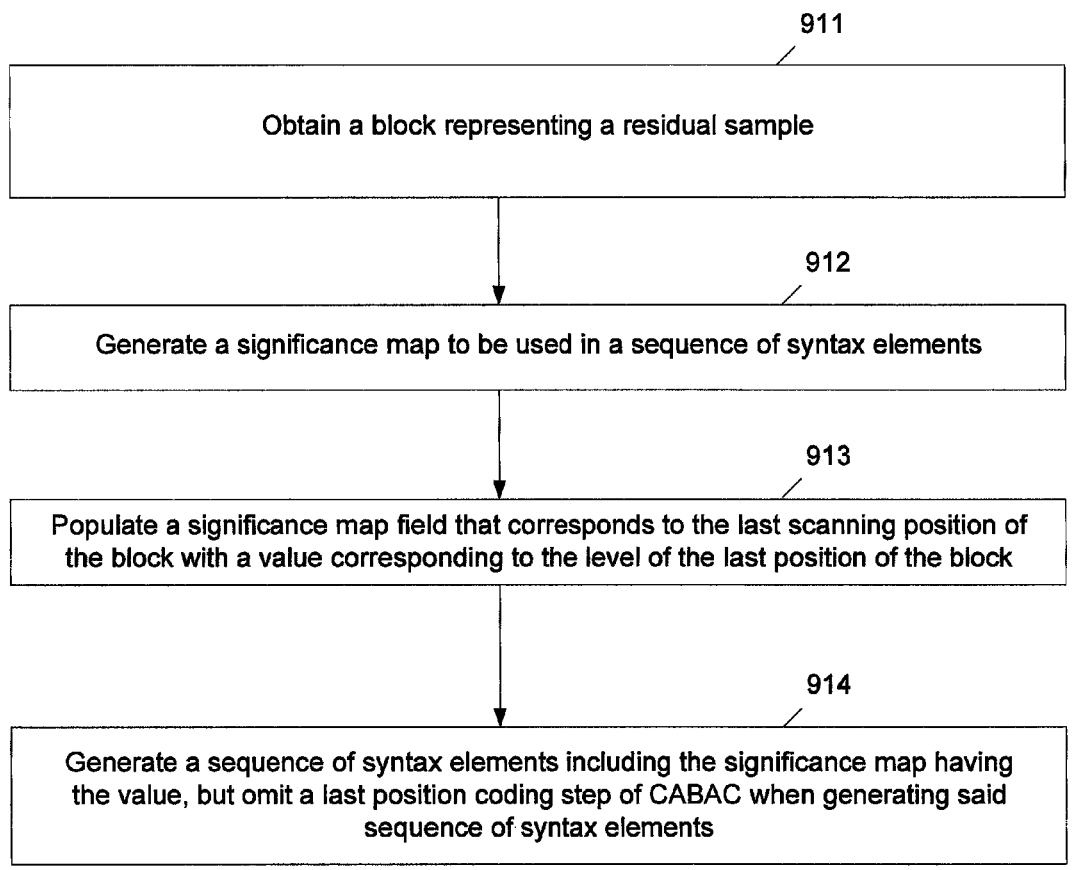
FIG. 13 is a flow diagram illustrating one configuration of a method for lossless coding on an electronic device.

FIG. 13 is a flow diagram illustrating one configuration of a method for lossless coding on an electronic device.

In block 911, the electronic device 1421 obtains a block representing a residual sample. In one example, zig-zag scanning direction may be redefined to fit the direction of intra prediction that is used to remove the spatial redundancies between neighboring pixels. There are several intra prediction modes available in lossless intra coding mode. In one example, in vertical intra prediction mode, upper pixels become the prediction value of the current pixel value and the difference between the current value and the prediction value (upper pixel value in vertical mode) become the residual sample value. Context model selection may also depend on the direction of intra prediction and the corresponding block size.

In block 912, the electronic device 1421 generates a significance map to be used in a sequence of syntax elements. In block 913, the electronic device 1421 populates a significance map field that corresponds to the last scanning position of the block with a value corresponding to the level of the last position of the block.

In block 914, the electronic device 1421 generates a sequence of syntax elements including the significance map having said value. Generating the sequence of syntax elements excludes the last position coding step of conventional CABAC lossless coding mode.

FIG. 14 is a table showing a sequence of syntax elements according to the configuration illustrated in FIG. 13.

Figure 11:
FIG. 11 is a table showing a sequence of syntax elements according to a lossless coding mode in CABAC.

Several differences can be observed by way of contrast of the sequence of syntax elements shown in FIG. 14 as compared to the sequence of syntax elements shown in FIG. 11. The sequence of syntax elements shown in FIG. 11 includes a Last_position_X field and a Last_position_Y field because the conventional CABAC lossless coding mode includes a last position coding step. In contrast, the sequence of syntax elements shown in FIG. 14 does not include a Last_position_X field and a Last_position_Y field because the configuration of FIG. 14 omits the last position coding step.

While both of the sequence of syntax elements include significance maps, there are differences between the significance maps. In the significance map of the sequence of syntax elements of FIG. 11, a significance map field is unpopulated to correspond with the field of Last_position_X/Last_position_Y that is populated. In contrast, in FIG. 14 a significance map field that corresponds to the last scanning position of the block is populated with a value, "0" for the example block, corresponding to the level of the last position of the block.

Figure 15:
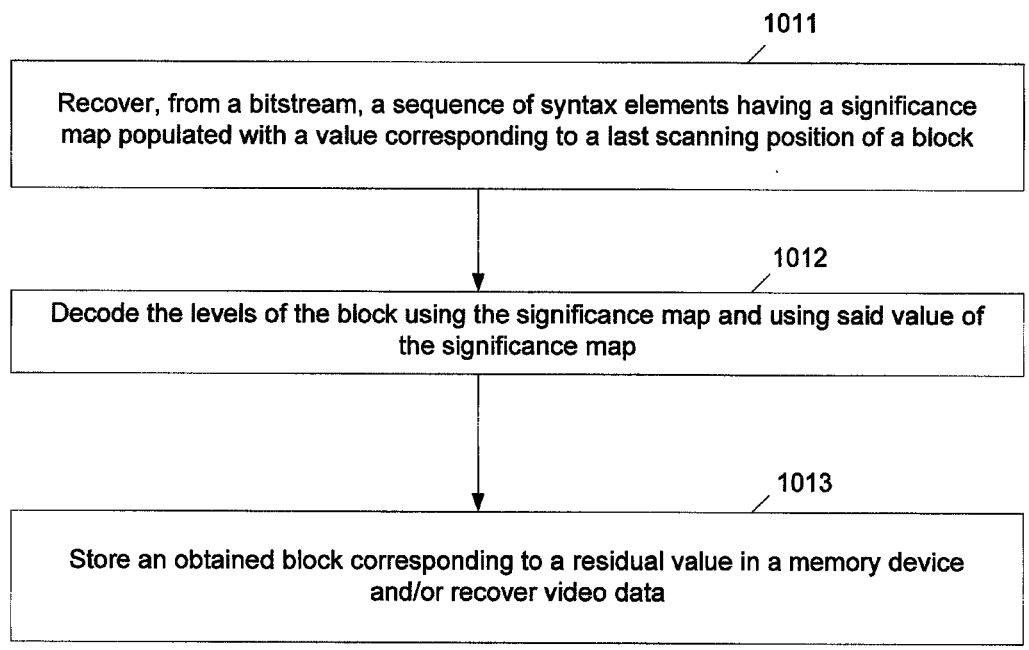
FIG. 15 is a flow diagram illustrating one configuration of a method for lossless decoding on an electronic device at the decode-side.

FIG. 15 is a flow diagram illustrating one configuration of a method for lossless decoding on an electronic device at the decode-side.

In block 1011, the electronic device 1422 recovers, from a bitstream, a sequence of syntax elements having a significance map populated with a value corresponding to a last scanning position of a block. In block 1012, the electronic device 1422 decodes the levels of the block using the significance map and using said value of the significance map. In block 1013, the electronic device 1422 stores an obtained block corresponding to a residual value in a memory device and/or recovers video data.

Figure 16:
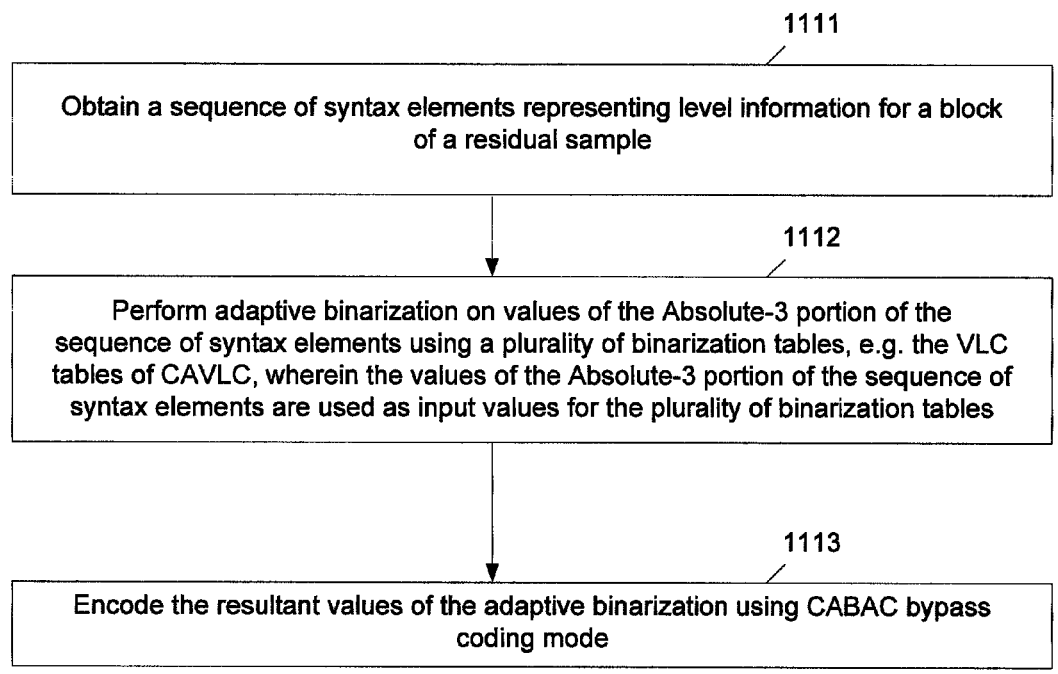
FIG. 16 is a flow diagram illustrating another configuration of a method for lossless coding on an electronic device.

FIG. 16 is a flow diagram illustrating another configuration of a method for lossless coding on an electronic device.

In block 1111, the electronic device 1421 obtains a sequence of syntax elements representing level information for a block of a residual sample. In block 1112, the electronic device 1421 performs adaptive binarization on values of the Absolute −3 portion of the sequence of syntax elements using a plurality of binarization tables, e.g. the VLC tables of CAVLC (FIG. 10), wherein the values of the Absolute −3 portion of the sequence of syntax elements are used as input values for the plurality of binarization tables. An equation for updating the binarization tables based on previous input information is shown below:

if ('abs[coefficient(i)]−3'>(Table[vlc])) vlc ++;
where Table [vlc]={3,5,13,27};
'i' represents scanning position and 'vlc' represents the current vlc table number
*vlc is first set to zero (or one for intra slice) because there is no available previous 'Absolute −3' vlc Table updated is stopped when vlc is equal to 4

In an example, block 1111 may include initially using values from the column VLC-Table-0 (FIG. 10) for inter slice and the column VLC-Table-1 for intra slice to binarize at least the first input value. The VLC table number may be monotomically increased when a previous value is larger than the given threshold values, e.g. 3, 5, 13, 27. Accordingly, subsequent adaptive binarization after the first monotomical increase may use values from the column VLC-Table-1, subsequent adaptive binarization after the second monotomical increase may use values from the column VLC-Table-2, etc.

In block 1113, the electronic device 1421 encodes the resultant values of the adaptive binarization using CABAC bypass coding mode.

Figure 17:
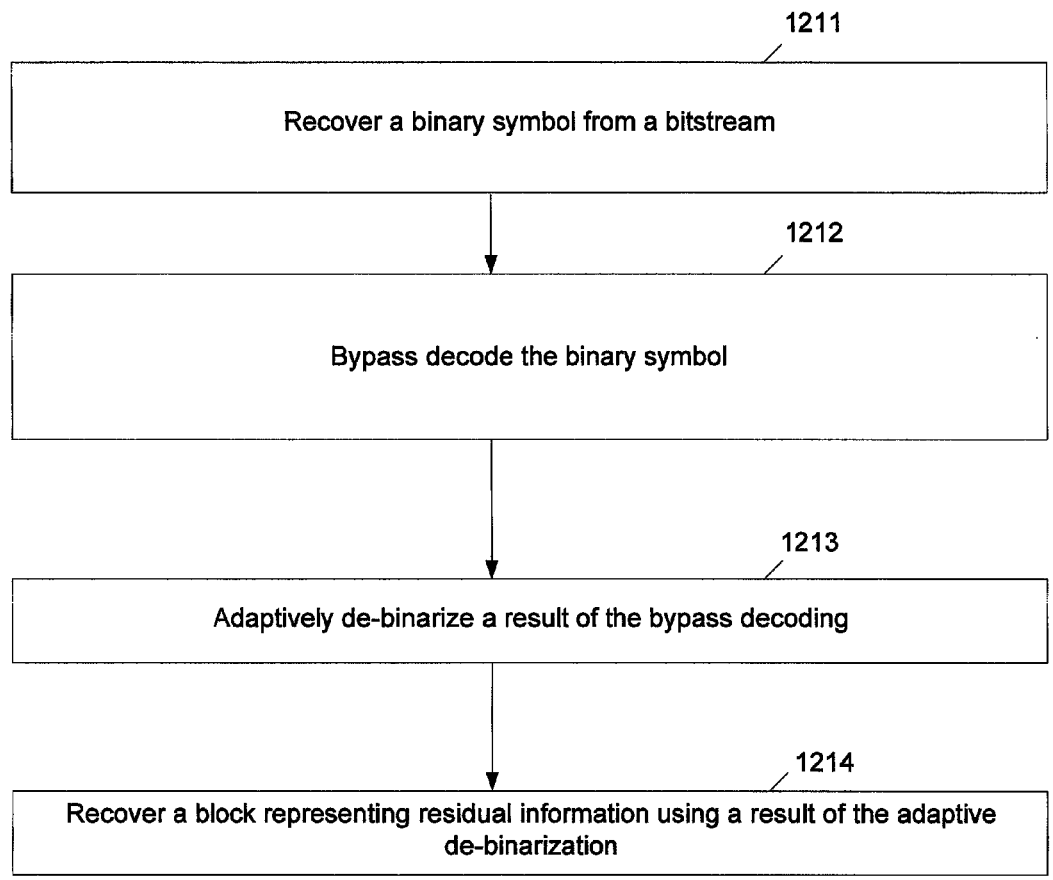
FIG. 17 is a flow diagram illustrating another configuration of a method for lossless coding on an electronic device at the decode-side.

FIG. 17 is a flow diagram illustrating another configuration of a method for lossless coding on an electronic device at the decode-side.

In block 1211, the electronic device 1422 recovers a binary symbol from a bitstream. In block 1212, the electronic device 1422 bypass decodes the binary symbol. In block 1213, the electronic device 1422 adaptively de-binarizes a result of the bypass decoding. In block 1214, the electronic device 1422 recovers a block representing residual information using a result of the adaptive de-binarization.

Figure 18:
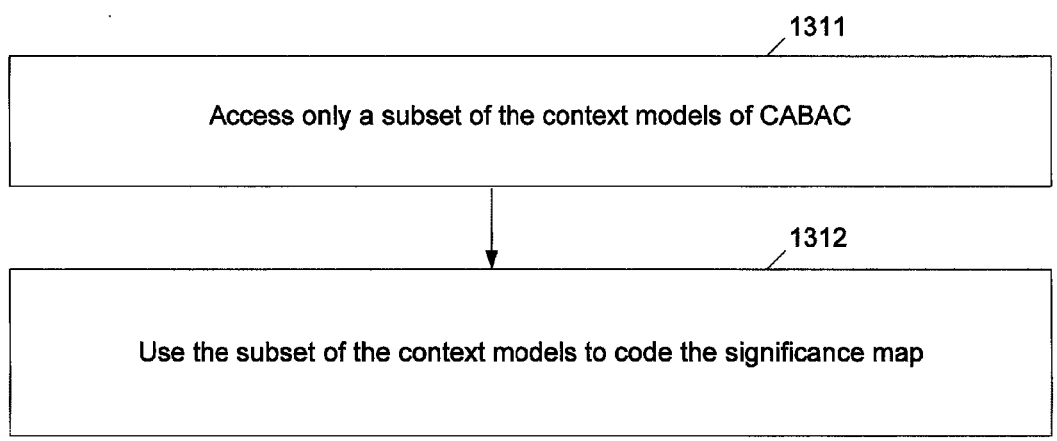
FIG. 18 is a flow diagram illustrating yet another configuration of a method for lossless coding on an electronic device.

FIG. 18 is a flow diagram illustrating yet another configuration of a method for lossless coding on an electronic device.

In block 1311, the electronic device 1421 accesses only a subset of the context models of CABAC. The number of context models of CABAC may be 184. In order to generate the subset, these context models may be filtered based on associated characteristics of the context models, e.g. based on relationship to frequency component, based on which context models are associated with the last position coding step of CABAC, or the like, or any combination thereof. The filtering may be performed by the electronic device 1421 in one example, but in other examples the subset may be provided to the electronic device 1421 so that the electronic device 1421 may access the provided subset for lossless coding mode.

In one example, all the CABAC context models related to frequency component may be eliminated to obtain the subset. Such a subset includes 26 context models, i.e. two context models (one is for luma and the other is for chroma) used for generating the significance map, and 6 context models are used for Greater_than_1 flag of luma, Greater_than_1 flag of chroma, Greater_than_2 flag of luma, and Greater_than_2 flag of chroma, respectively. Therefore, total 24 context models are used for Greater_than_1 and Greater_than_2.

As shown In Table (3), 6 context models may depend on the sub-block type and the number of LargerT1 in the previous sub block. Here LargerT1 indicates coefficients larger than 1. For sub-blocks, different block sizes according to its sample size (4×4, 8×8, 16×16, 32×32, 16×32, etc.) is further divided into sub-blocks and In the level coding including Greater_than_1 flag and Greater_than_2 flag. Here, sub-block 0 indicates the last coded sub-block. In one example, if the current block size is 4×4, we have one sub-block which is sub-block 0. If the corresponding block size is 8×8, then we have 4 sub-blocks and the last scanned (or coded) sub-block is considered to be sub-block 0. Note that sub-block scanning method may be various.

TABLE (3)

| | 6 context models based on sub-block type and LargerT1 | |
|---|---|---|
| 0 | Sub block 0 | 0 LargerT1 in previous subset |
| 1 | | 1-3 LargerT1 in previous subset |
| 2 | | >3 LargerT1 in previous subset |
| 3 | Other sub blocks | 0 LargerT1 in previous subset |
| 4 | | 1-3 LargerT1 in previous subset |
| 5 | | >3 LargerT1 in previous subset |

In block 1312, the electronic device 1421 uses the subset of the context models to code the significance map.

Figure 19:
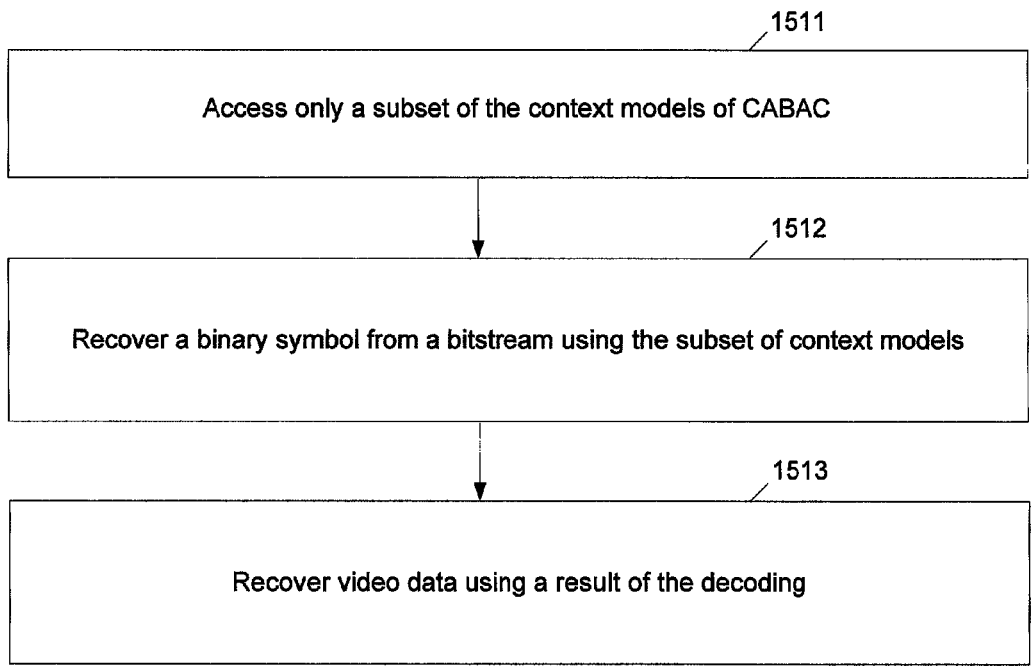
FIG. 19 is a flow diagram illustrating yet another configuration of a method for lossless coding on an electronic device at the decode-side.

FIG. 19 is a flow diagram illustrating yet another configuration of a method for lossless coding on an electronic device at the decode-side.

In block 1511, the electronic device 1422 accesses only a subset of the context models of CABAC. In block 1512, the electronic device 1422 recovers a binary symbol from a bitstream using the subset of context models. In block 1513, the electronic device 1422 recovers video data using a result of the decoding.

In the foregoing, configurations that may be implemented by the electronic device 1421 are illustrated in FIGS. 13, 16, and 18. Configuring an encoder with all of these configurations improves coding performance compared to known CABAC lossless coding mode. Nevertheless, configuring an encoder with less than all of these configurations in any combination, e.g. one of these configurations or any two of these configurations, is also possible and practical, and also improves coding performance compared to known CABAC lossless coding mode.

In the foregoing, configurations that may be implemented by the electronic device 1422 are illustrated in FIGS. 14, 17, and 19. Configuring a decoder with all of these configurations improves coding performance compared to known CABAC lossless coding mode. Nevertheless, configuring a decoder with less than all of these configurations in any combination, e.g. one of these configurations or any two of these configurations, is also possible and practical, and also improves coding performance compared to known CABAC lossless coding mode.

In an example, an electronic device including a processor and a memory in electronic communication with the processor is provided. Stored in the memory are instructions executable by the processor to perform operations.

In an example, an operation may include obtaining a block representing a residual sample for lossless encoding. Another operation may include generating a significance map, wherein the generating includes populating a significance map field that corresponds to the last scanning position of the block with a value corresponding to a level of the last scanning position of the block. Another operation may include generating a sequence of syntax elements including the significance map having the value. Another operation may include transmitting a bitstream representing the generated sequence of syntax elements to a decoder.

In an example, the sequence of syntax elements is generated without performing the last position coding step of Context Adaptive Binary Arithmetic Coding (CABAC).

In an example, another operation may include performing perform adaptive binarization using a plurality of binarization tables, wherein values of an Absolute −3 portion of the sequence of syntax elements are used as input values for the plurality of binarization tables. Another operation may include encoding a result of the adaptive binarization. The plurality of binarization tables may be VLC tables of CAVLC.

In an example, encoding the result of the adaptive binarization may include additional operations. An additional operation may include utilizing a CABAC bypassing coding mode.

In an example, the adaptive binarization of the input values using the plurality of binarization tables may include additional operations. An additional operation may include determining whether one of the input values is greater than a preset threshold. An additional operation may include performing a table update responsive to determining that said input value is greater than the preset threshold.

In an example, another operation may include accessing only a subset of the context models of CABAC. Another operation may include using the subset of the context models to code the significance map. The subset may comprise the context models of CABAC that do not represent frequency component(s).

In an example, an electronic device including a processor and a memory in electronic communication with the processor is provided. Stored in the memory are instructions executable by the processor to perform operations.

In an example, an operation may include obtaining a block representing a residual sample for lossless encoding. Another operation may include generating a sequence of syntax elements to represent the block. Another operation may include performing adaptive binarization using a plurality of binarization tables, wherein values of an Absolute −3 portion of the sequence of syntax elements are used as input values for the plurality of binarization tables. Another operation may include encoding a result of the adaptive binarization. Another operation may include transmitting the encoding to a decoder.

In an example, the plurality of binarization tables are VLC tables of CAVLC.

In an example, encoding the result of the adaptive binarization may include additional operations. An additional operation may include utilizing a Context Adaptive Binary Arithmetic Coding (CABAC) bypassing coding mode.

In an example, the adaptive binarization of the input values using the plurality of binarization tables may include additional operations. An additional operation may include determining whether one of the input values is greater than a preset threshold. An additional operation may include performing a table update responsive to determining that said input value is greater than the preset threshold.

In an example, another operation may include generating a significance map, wherein the generating includes populating a significance map field that corresponds to the last scanning position of the block with a value corresponding to a level of the last scanning position of the block. Another operation may include generating the sequence of syntax elements using the generated significance map.

In an example, the sequence of syntax elements is generated without performing the last position coding step of CABAC.

In one example, a method is provided. The method may be performed using a decoder. One operation of the method may include filtering the context models of Context Adaptive Binary Arithmetic Coding (CABAC) based on relationship to frequency component. Another operation of the method may include obtaining a bitstream. Another operation of the method may include recovering a binary symbol from the bitstream. Another operation of the method may include decoding the binary symbol using the filtered context models. Another operation of the method may include recovering video data using a result of the decoding.

In an example, another operation may include recovering, from the bitstream, a sequence of syntax elements having a significance map populated with a value corresponding to a last scanning position of a block representing a residual sample. Another operation may include decoding the levels of the block using the significance map and using said value of the significance map.

In an example, the decoding of the levels of the block may be performed without performing the last position decoding step of CABAC.

In an example, another operation may include bypass decoding the recovered binary symbol. Another operation may include adaptively de-binarizing a result of the bypass decoding. Another operation may include recovering a block representing residual information using a result of the de-binarization.

In an example, another operation may include using a plurality of VLC tables of CAVLC for the adaptive de-binarization.

In an example, the bypass decoding may include utilizing a CABAC bypass decoding mode.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. One or more of the operations, processes, and/or methods described herein may be performed by an apparatus, a device, and/or a system substantially similar to those as described herein and with reference to the illustrated figures.

A processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a conventional rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. An apparatus, comprising:
an electronic device configured to:
   obtain a block representing a residual sample for lossless encoding;
   generate a significance map, wherein the generating includes populating a significance map field that corresponds to the last scanning position of the block with a value corresponding to a level of the last scanning position of the block;
   generate a sequence of syntax elements including the significance map having the value; and
   transmit a bitstream representing the generated sequence of syntax elements to a decoder.

2. The apparatus of claim 1, wherein the sequence of syntax elements is generated without performing the last position coding step of Context Adaptive Binary Arithmetic Coding (CABAC).

3. The apparatus of claim 1, wherein the electronic device is further configured to:
   perform adaptive binarization using a plurality of binarization tables, wherein values of an Absolute −3 portion of the sequence of syntax elements are used as input values for the plurality of binarization tables; and
   encode a result of the adaptive binarization.

4. The apparatus of claim 3, wherein the plurality of binarization tables are VLC tables of CAVLC.

5. The apparatus of claim 4, wherein the encoding the result of the adaptive binarization further comprises utilizing a CABAC bypassing coding mode.

6. The apparatus of claim 3, wherein the adaptive binarization of the input values using the plurality of binarization tables further comprises:
   determining whether one of the input values is greater than a preset threshold; and
   performing a table update responsive to determining that said input value is greater than the preset threshold.

7. The apparatus of claim 1, wherein electronic device is further configured to:
   access only a subset of the context models of CABAC; and
   use the subset of the context models to code the significance map.

8. The apparatus of claim 7, where the subset comprises the context models of CABAC that do not represent frequency component(s).

9. An apparatus, comprising:
an electronic device configured to:
   obtain a block representing a residual sample for lossless encoding;
   generate a sequence of syntax elements to represent the block;
   perform adaptive binarization using a plurality of binarization tables, wherein values of an Absolute −3 portion of the sequence of syntax elements are used as input values for the plurality of binarization tables;
   encode a result of the adaptive binarization; and
   transmit the encoding to a decoder.

10. The apparatus of claim 9, wherein the plurality of binarization tables are VLC tables of CAVLC.

11. The apparatus of claim 10, wherein encoding the result of the adaptive binarization further comprises utilizing a Context Adaptive Binary Arithmetic Coding (CABAC) bypassing coding mode.

12. The apparatus of claim 9, wherein the adaptive binarization of the input values using the plurality of binarization tables further comprises:
   determining whether one of the input values is greater than a preset threshold; and
   performing a table update responsive to determining that said input value is greater than the preset threshold.

13. The apparatus of claim 9, wherein the electronic device is further configured to:
   generate a significance map, wherein the generating includes populating a significance map field that corresponds to the last scanning position of the block with a value corresponding to a level of the last scanning position of the block; and
   generate the sequence of syntax elements using the generated significance map.

14. The apparatus of claim 9, wherein the sequence of syntax elements is generated without performing the last position coding step of CABAC.

15. A method, comprising:
   filtering the context models of Context Adaptive Binary Arithmetic Coding (CABAC) based on relationship to frequency component;
   obtaining a bitstream;
   recovering a binary symbol from the bitstream;
   decoding the binary symbol using the filtered context models; and
   recovering video data using a result of the decoding.

16. The method of claim 15, further comprising:
   recovering, from the bitstream, a sequence of syntax elements having a significance map populated with a value corresponding to a last scanning position of a block representing a residual sample; and decoding the levels of the block using the significance map and using said value of the significance map.

17. The method of claim 16, wherein the decoding of the levels of the block is performed without performing the last position decoding step of CABAC.

18. The method of claim 15, further comprising:
bypass decoding the recovered binary symbol;
adaptively de-binarizing a result of the bypass decoding; and
recovering a block representing residual information using a result of the de-binarization.

19. The method of claim 18, further comprising using a plurality of VLC tables of CAVLC for the adaptive de-binarization.

20. The method of claim 19, wherein the bypass decoding further comprises utilizing a CABAC bypass decoding mode.

* * * * *